US009178486B2

United States Patent
Mechanic et al.

(10) Patent No.: US 9,178,486 B2
(45) Date of Patent: Nov. 3, 2015

(54) GFCI COMPATIBLE SYSTEM AND METHOD FOR ACTIVATING RELAY CONTROLLED LINES HAVING A FILTER CIRCUIT BETWEEN NEUTRAL AND GROUND

(71) Applicant: Smart Power Systems, Inc., Houston, TX (US)

(72) Inventors: Bahram Mechanic, Houston, TX (US); Tooraj Faridi, Houston, TX (US)

( * ) Notice: Subject to any disclaimer, the term of this patent is extended or adjusted under 35 U.S.C. 154(b) by 0 days.

(21) Appl. No.: 14/451,403

(22) Filed: Aug. 4, 2014

(65) Prior Publication Data

US 2014/0340170 A1 Nov. 20, 2014

Related U.S. Application Data

(63) Continuation-in-part of application No. 12/963,330, filed on Dec. 8, 2010, now abandoned.

(51) Int. Cl.
| | |
|---|---|
| *H02H 3/00* | (2006.01) |
| *H02H 9/08* | (2006.01) |
| *H02H 3/22* | (2006.01) |
| *H03H 7/01* | (2006.01) |
| *H02H 1/04* | (2006.01) |

(52) U.S. Cl.
CPC .............. *H03H 7/0153* (2013.01); *H02H 1/04* (2013.01); *H03H 7/17* (2013.01)

(58) Field of Classification Search
CPC ........... H02H 3/16; H02H 3/162; H02H 3/26; H02H 3/331; H01H 83/144
USPC ........................................ 361/42, 45, 49, 111
See application file for complete search history.

(56) References Cited

U.S. PATENT DOCUMENTS

| | | | | |
|---|---|---|---|---|
| 3,949,336 | A * | 4/1976 | Dietz ............................. | 335/166 |
| 5,619,174 | A * | 4/1997 | Kimura et al. ................ | 333/181 |
| 5,666,255 | A * | 9/1997 | Muelleman .................... | 361/111 |
| 5,721,661 | A * | 2/1998 | Mechanic ...................... | 361/118 |
| 6,040,969 | A * | 3/2000 | Winch et al. ..................... | 361/82 |
| 6,229,682 | B1 | 5/2001 | Mechanic | |
| 7,082,021 | B2 | 7/2006 | Chan | |
| 7,375,939 | B2 * | 5/2008 | Weil ................................ | 361/45 |
| 2001/0026431 | A1 * | 10/2001 | Mechanic ...................... | 361/111 |
| 2003/0151864 | A1 * | 8/2003 | Tamura ........................... | 361/46 |
| 2005/0088792 | A1 * | 4/2005 | Mechanic et al. ........... | 361/91.1 |
| 2005/0243485 | A1 * | 11/2005 | Gershen et al. ................. | 361/42 |
| 2006/0268472 | A1 * | 11/2006 | Winch ............................. | 361/42 |
| 2010/0046129 | A1 * | 2/2010 | Mikrut ............................ | 361/45 |
| 2013/0257451 | A1 * | 10/2013 | Nozaki ........................ | 324/551 |

\* cited by examiner

*Primary Examiner* — Thienvu Tran
*Assistant Examiner* — Christopher Clark
(74) *Attorney, Agent, or Firm* — Spradley PLLC; Michael Spradley

(57) ABSTRACT

A GFCI compatible system and method for activating relay controlled lines having a filter circuit between neutral and ground is described herein. Specifically the disclosure teaches a GFCI compatible system for reducing CMN. A CMN Suppressor can comprise a hot line, a neutral line, and a ground line. The first ends of the hot line, the neutral line, and the ground line can be connected to a GFCI protected hot node, a GFCI protected neutral node, and an electrical ground. The second ends of the hotline, the neutral line, and the ground line can be connected to a CMN sensitive device hot line, a CMN sensitive device neutral line, and a CMN sensitive device ground line. The system can further comprise a high pass filter, a hot line relay contact, a neutral line relay contact, a hot line relay, and a neutral line power relay.

15 Claims, 14 Drawing Sheets

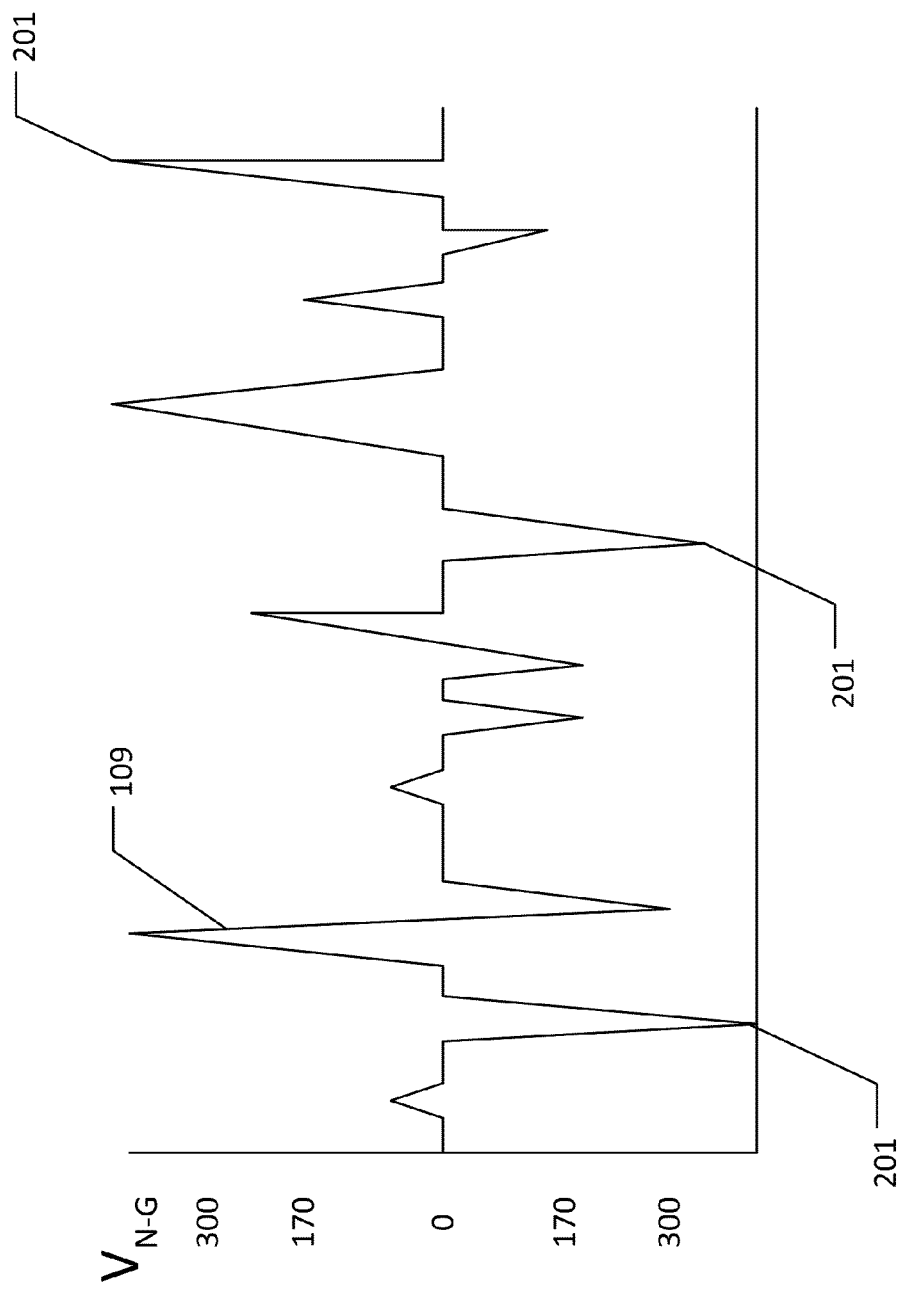

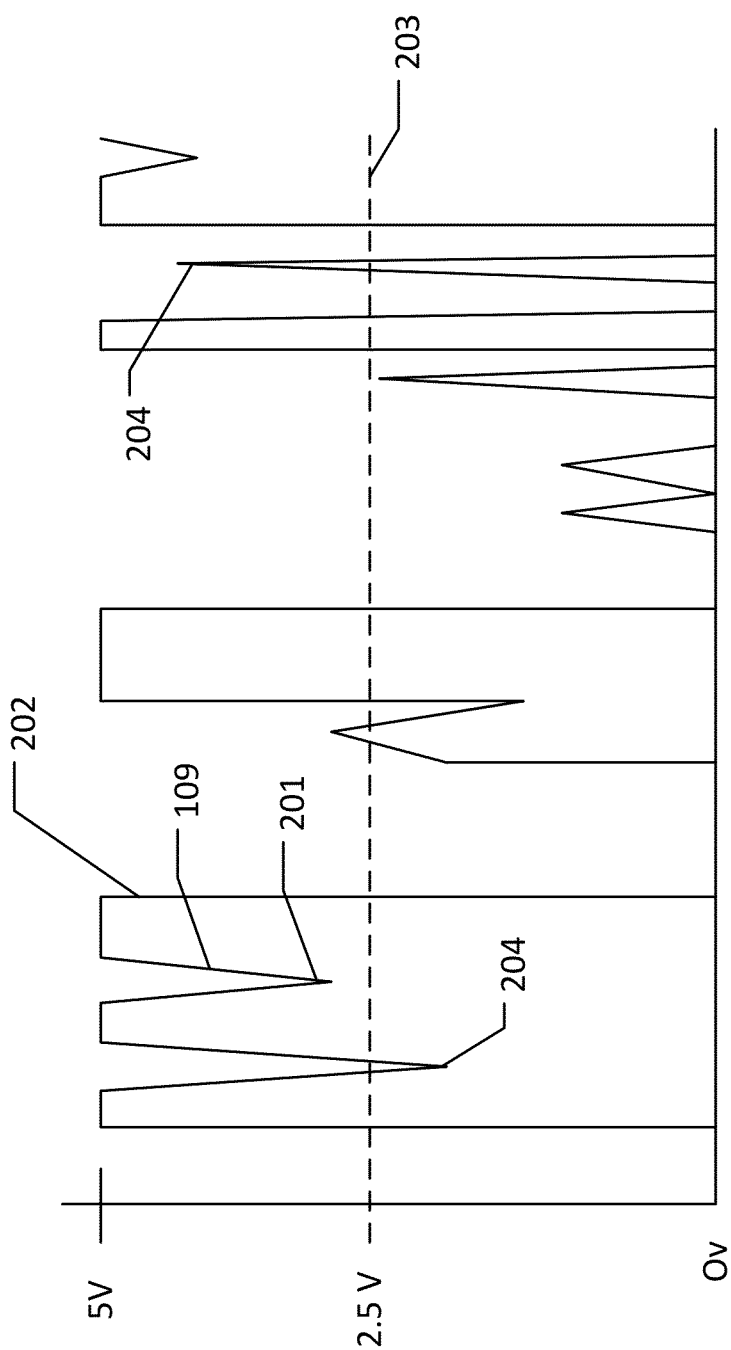

GFCI COMPATIBLE SYSTEM AND METHOD FOR ACTIVATING RELAY CONTROLLED LINES HAVING A FILTER CIRCUIT BETWEEN NEUTRAL AND GROUND

PRIORITY

This patent application is a continuation-in-part of U.S. patent application Ser. No. 12/963,330, entitled "TBF Compatible with Input Power Including GFCI," filed Dec. 8, 2010, which is hereby incorporated by reference.

BACKGROUND

Transient voltages adversely affect power circuits. Many people mistakenly believe that most problems caused by transient voltages are the result of lightning strikes and black outs. However, the majority of the problems are the result of common mode noise (CMN). CMN occurs between the neutral line and ground line or between a hot line and a ground line. CMN has many causes including, but not limited to, computer power supplies and the starting and stopping of motors. CMN manifests itself as small voltage shifts in the ground line. Further, CMN can be viewed as a higher frequency signal that has been added to the fundamental frequency of the electrical signal. Typically this fundamental frequency is 60 [Hz] while the frequency of CMN can typically exceed 100 [kHz]. Since equipment on a typical electrical network share a common ground, such equipment on the electrical network sees these voltage shifts.

CMN causes logic confusion in microprocessors, which is a common source of malfunctions in these devices. Microprocessors are binary devices that transmit and compute data using a series of ones and zeroes. A microprocessor views 5V with respect to ground as a one, while 0V with respect to ground, a zero. CMN can prevent the voltage seen by the microprocessor from reaching 0V. Thus the microprocessor will mistakenly read a zero as a one causing logic errors. Likewise, CMN can also prevent the voltage from reaching 5V and causing the microprocessor to mistakenly read a one as a zero. Such logic errors can lead to microprocessors misreading data, programs not functioning properly, and even system crashes.

An early solution to filter out CMN was the isolation transformer. However, as power systems became more complex, CMN became more severe and isolation transformers became less economical. New power filtration circuits were developed as a more economical alternative to isolation transformers. An example of a power filtration filter is the Transformer Based Filter (TBF) developed by Smart Power Systems, Inc. Such power filtration circuits used inductors on the neutral line of the circuit and capacitors connected between the neutral and the ground to filter out CMN transient voltage spikes.

Those circuits provide excellent filtration of CMN. However, the presence of neutral-to-ground connections allows current to leak from neutral to ground. Such leakage causes ground fault circuit interrupters (GFCI) to trip. GFCIs are used to protect people from electrical shocks caused by ground faults. GFCIs work by measuring the current entering and leaving the GFCI through the hot and neutral lines. If these currents do not sum to zero then the GFCI opens the circuit. In order to meet Underwriters Laboratories ("UL") 943 standard a GFCI must trip the circuit before the sum of the currents exceeds 4-6 mA. The National Electric Code (NEC) has added requirements for GFCIs in more locations. The increase in GFCI protected circuits has made it more difficult for individuals to install TBFs to protect sensitive electrical equipment from CMN.

Many power filtration circuits are not compatible with GFCIs because GFCIs view leakage current as a ground fault. If a GFCI views leakage current as a ground fault, the GFCI can trip the circuit. In order to prevent GFCI trips, sometimes purchasers of such power filtration circuits disable the GFCI. Also, isolation transformers disable a GFCI because the GFCI fails to detect what is happening on the secondary side of the transformer. This is unacceptable because the NEC requires GFCI protection in many locations. Further, disabling GFCI protection increases the risk to individuals who are operating devices connected to the power filtration circuits. This issue has led many power filtration circuit manufacturers to specifically state their devices are incompatible with GFCIs.

As such, it would be advantage to have a GFCI compatible system and method for reducing CMN.

Another issue with power filtration circuits is GFCI trips due to un-sequenced relay contact connections. Specifically, when a filter is connected between neutral and ground, if a hot line energizes before a neutral line is connected, some current can pass through the filter to ground causing the GFCI to trip.

As such, it would be advantageous to have a GFCI compatible system and method for activating relay-controlled lines having a filter circuit between neutral and ground.

SUMMARY

A GFCI compatible system and method for activating relay controlled lines having a filter circuit between neutral and ground is described herein. Specifically the disclosure teaches a GFCI compatible system for reducing CMN. A CMN Suppressor can comprise a hot line, a neutral line, and a ground line. The first ends of the hot line, the neutral line, and the ground line can be connected to a GFCI protected hot node, a GFCI protected neutral node, and an electrical ground. The second ends of the hotline, the neutral line, and the ground line can be connected to a CMN sensitive device hot line, a CMN sensitive device neutral line, and a CMN sensitive device ground line. The system can further comprise a high pass filter, a hot line relay contact, a neutral line relay contact, a hot line relay, and a neutral line power relay. The high pass filter can be connected between the neutral line and the ground line. The hot line relay contact and the neutral line relay contact can be operable to open and close. The hot line relay can be capable of opening and closing the hot line relay contact. The neutral line power relay can be capable of opening and closing the neutral line relay contact. The neutral line relay can be capable of opening the neutral line relay contact when the hot line relay contact is open. The hot line relay can be capable of closing the hot line relay contact when the neutral line relay contact is in a closed position.

The disclosure also teaches a method for connecting a CMN suppressor to a GFCI protected load. The method can comprise the step of connecting first ends of a hot line, a neutral line, and a ground line within a CMN suppressor to a GFCI protected hot node, a GFCI protected neutral node, and a GFCI protected ground node. The CMN suppressor can comprise a high pass filter, a hot line relay contact, a neutral line relay contact, a hot line relay, and a neutral line relay. The high pass filter can connect the neutral line to the ground line. The hot line relay contact can be capable of opening and closing within the hot line. The neutral line relay contact can be capable of opening and closing within the neutral line. The hot line relay can be capable of controlling the hotline relay contact. The neutral line relay can be capable of controlling the neutral line relay contact. The method can further comprise the steps of closing the neutral line relay contact using the neutral line relay, and closing the hot line relay contact using the hot line relay, only after closing the neutral line relay contact.

BRIEF DESCRIPTION OF THE DRAWINGS

FIG. 2A illustrates a CMN on a GFCI protected ground node.

FIG. 2B illustrates an effect of a CMN on a signal not protected by a CMN suppressor.

DETAILED DESCRIPTION

Described herein is a GFCI compatible system and method for activating relay-controlled lines having a filter circuit between neutral and ground. The following description is presented to enable any person skilled in the art to make and use the invention as claimed and is provided in the context of the particular examples discussed below, variations of which will be readily apparent to those skilled in the art. In the interest of clarity, not all features of an actual implementation are described in this specification. It will be appreciated that in the development of any such actual implementation (as in any development project), design decisions must be made to achieve the designers' specific goals (e.g., compliance with system- and business-related constraints), and that these goals will vary from one implementation to another. It will also be appreciated that such development effort might be complex and time-consuming, but would nevertheless be a routine undertaking for those of ordinary skill in the field of the appropriate art having the benefit of this disclosure. Accordingly, the claims appended hereto are not intended to be limited by the disclosed embodiments, but are to be accorded their widest scope consistent with the principles and features disclosed herein.

Figure 1:
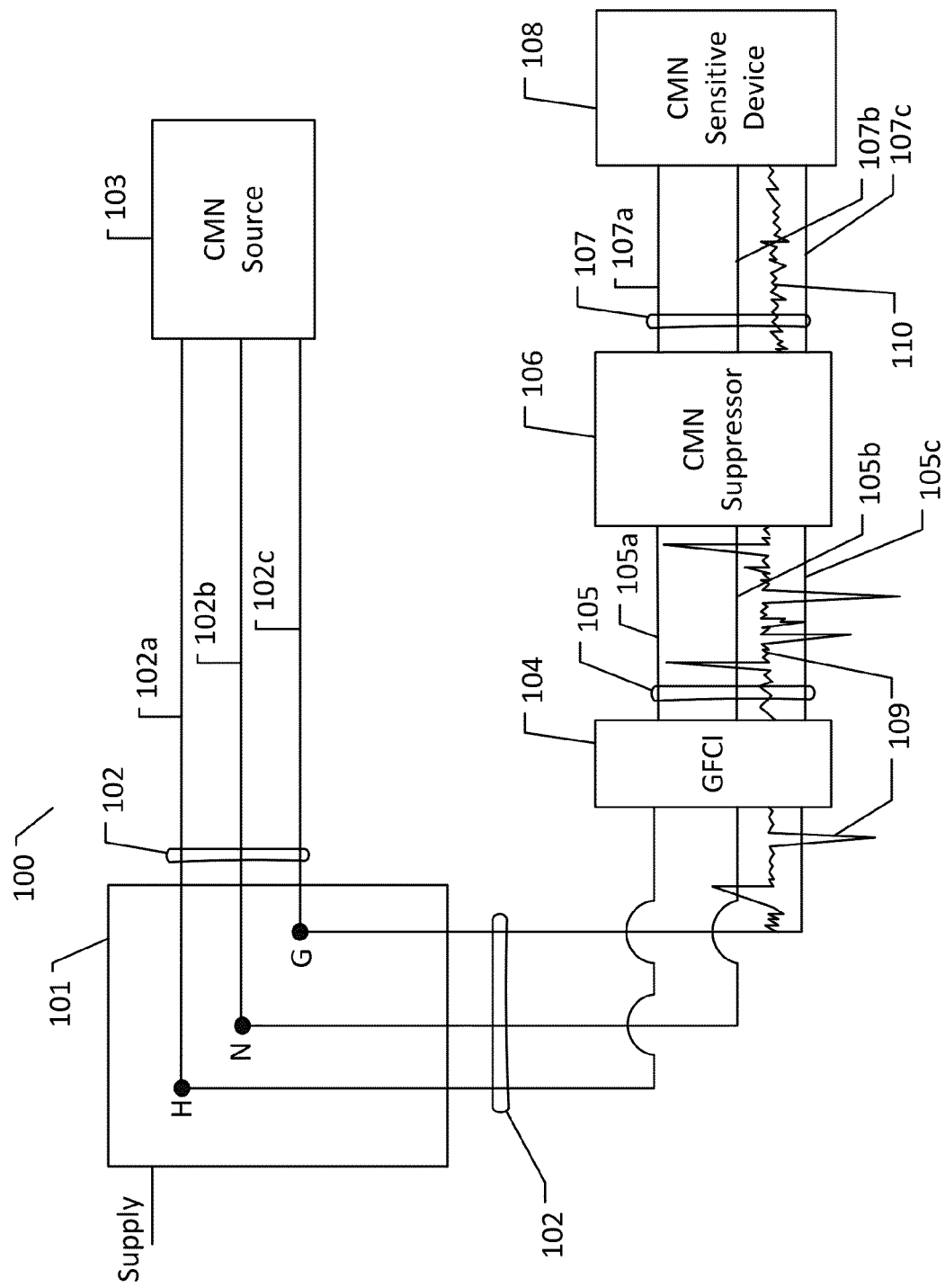
FIG. 1 illustrates an exemplary electrical network including an electric supply, CMN source, CMN Suppressor and CMN Sensitive Device.

FIG. 1 illustrates an electrical network 100. In one embodiment, electrical network 100 can comprise an electrical supply 101, nodes 102, one or more CMN sources 103, one or more ground fault current interrupters (GFCI) 104, GFCI monitored nodes 105, a CMN suppressor 106, CMN suppressor monitored nodes 107, and a CMN sensitive device 108. Electrical supply 101 can provide power to devices on electrical network 100 over nodes 102. Nodes 102 can comprise a hot node, 102a, a neutral node 102b, and a ground node 102c. All or portions of lines 102 can be monitored by GFCIs 104. For purpose of this disclosure, GFCI monitored nodes 105 are power delivery nodes immediately downstream from GFCI 104. Each GFCI monitored node 105 can comprise a GFCI monitored hot node 105a, a GFCI monitored neutral node 105b, and a GFCI monitored ground node 105c. However, practically speaking, GFCI monitored ground node 105c can be the same node as ground node 102c. GFCI monitored nodes 105 can connect GFCI 104 to CMN suppressor 106. Also for purpose of this disclosure, CMN suppressor monitored nodes 107 are power delivery nodes immediately downstream from CMN suppressor 106. Each CMN suppressor monitored node 107 can comprise a CMN suppressor monitored hot node 107a, a CMN suppressor monitored neutral node 107b, and a CMN suppressor monitored ground node 107c. CMN suppressor monitored nodes 107 can connect CMN suppressor 106 to CMN sensitive device 108. CMN sensitive devices 106 can include, but are not limited to, computers, copy machines, point of sale terminals, self-checkout terminals, and automatic teller machines.

CMN source 103 can receive power through nodes 102 or GFCI protected nodes 105. Examples of CMN sources 103 can include but are not limited to shredders, microwaves, ice machines, cappuccino machines, air conditioning units, refrigerators, elevators, and items with rectifier circuits. During operation, CMN source 103 can transmit CMN 109 back over nodes 102 or GFCI protected nodes 105. Further, CMN 109 can pass through GFCI 104 with little or no effect to CMN 109. CMN 109 can exist between hot node 102a and ground node 102c, neutral node 102b and ground node 102c, GFCI protected hot node 105a and GFCI protected ground node 105c, and/or GFCI protected neutral node 105b and GFCI protected ground node 105c. CMN suppressor 106 can substantially block CMN 109, allowing only a reduced CMN 110 to reach CMN sensitive device 108 over CMN suppressor monitored nodes 107.

FIG. 2A illustrates CMN 109 on GFCI protected ground node 105c. CMN can comprise one or more pulses, each having a peak voltage 201. Peak voltages 201 can vary greatly from fractions of a volt to hundreds of volts. Microprocessor based electronics such as copy machines, point of sale terminals, self-checkout terminals, and automatic teller machines can be sensitive to CMN 109 when peak voltage 201 exceeds 2[V]. Further, as microprocessor technology evolves, microprocessor operating-voltages continue to decrease, and as such, they become even more sensitive to CMN 109.

FIG. 2B illustrates an effect of CMN 109 on a signal 202 not protected by CMN suppressor 106. Signal 202 is exemplary of a signal read by a microprocessor within CMN sensitive device 108. As an example, signal 202 can vary between 0[V], and 5[V]. CMN sensitive device 108 can, at intermittent points, read voltages at or above a switching threshold 203 (in this example, 2.5[V]) as a "1" state, and voltages below switching threshold 203 as a "0" state. If peak voltage 201 of CMN 109 is ever greater than switching threshold 203, then CMN 109 can create a disturbance 204 within signal 202. For purposes of this disclosure, disturbance 204 can be a change in signal 202 that results in a "1" to be misread as a "0", or a "0" to be misread as a "1" by CMN sensitive device 108.

Figure 2C:
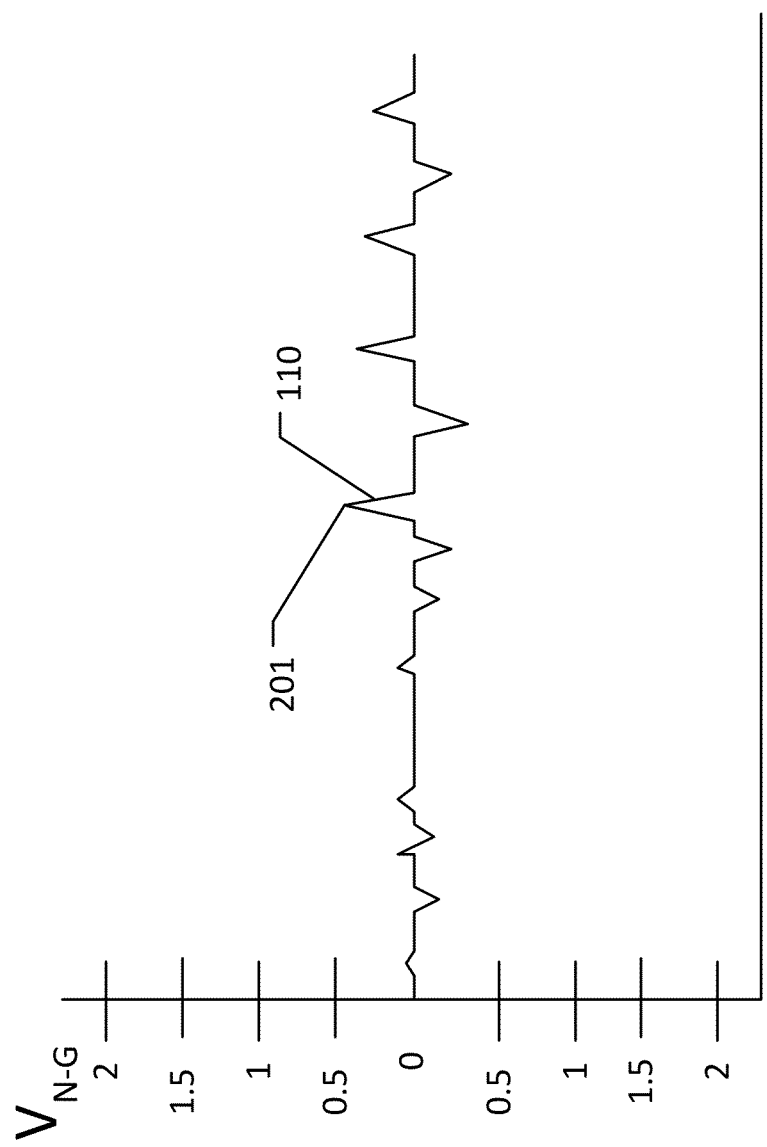
FIG. 2C illustrates a reduced CMN on a CMN suppressor protected ground node.

FIG. 2C illustrates reduced CMN 109 on a CMN suppressor protected ground node 107c. Given its broadest definition, reduced CMN 110 can be from zero to less than one hundred percent of the voltage of CMN 109. In a preferred embodiment, CMN suppressor 106 can decrease CMN 109 such that peak voltage 201 of reduced CMN 110 is less than a threshold voltage. In another preferred embodiment, CMN suppressor 106 can decrease CMN 109 such that peak voltage 201 of reduced CMN 110 is less than 0.5[V].

Figure 2D:
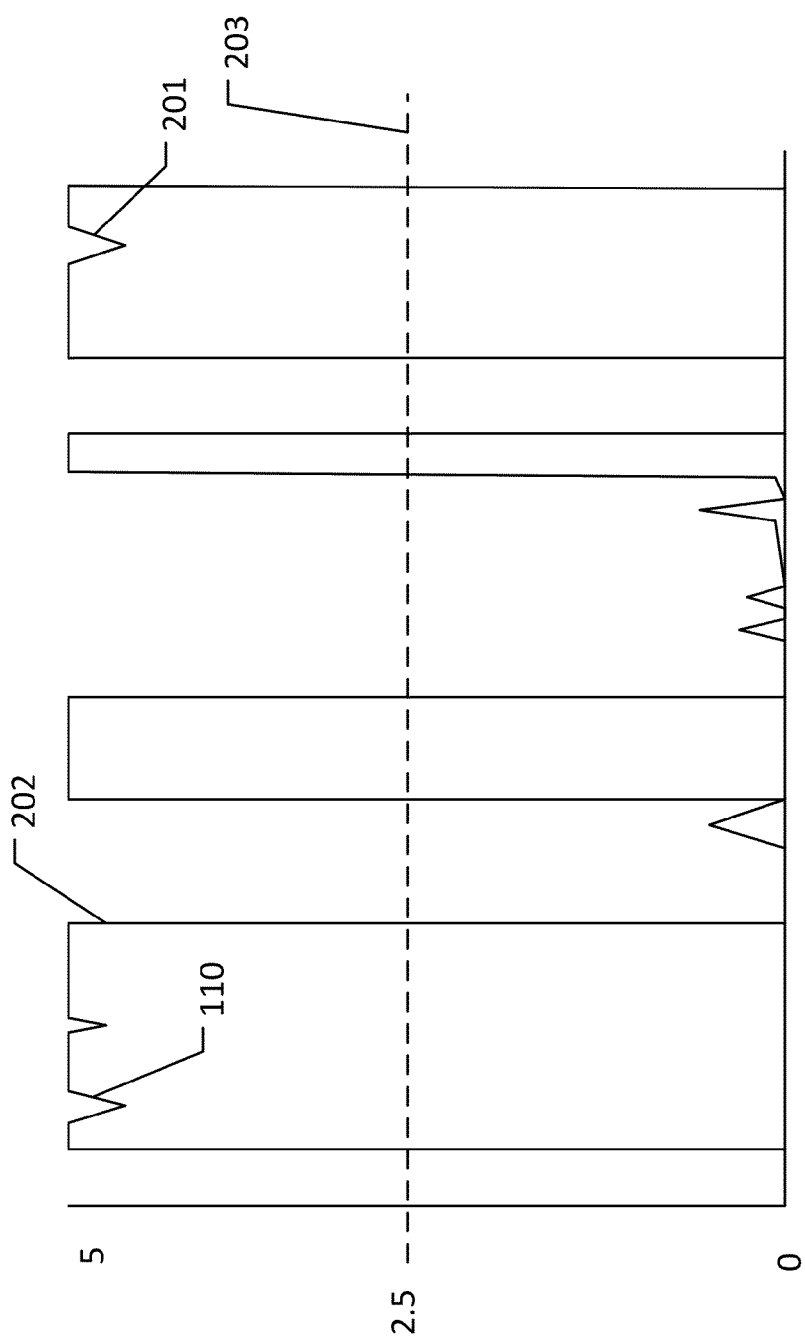
FIG. 2D illustrates an effect of reduced CMN on a signal protected by a CMN suppressor.

FIG. 2D illustrates an effect of reduced CMN 110 on signal 202 protected by CMN suppressor 106. In another preferred embodiment, CMN suppressor 106 can reduce CMN 109 such that peak voltage 201 of reduced CMN 110 is less than switching threshold 203, thereby eliminating disturbances 204.

Figure 3:
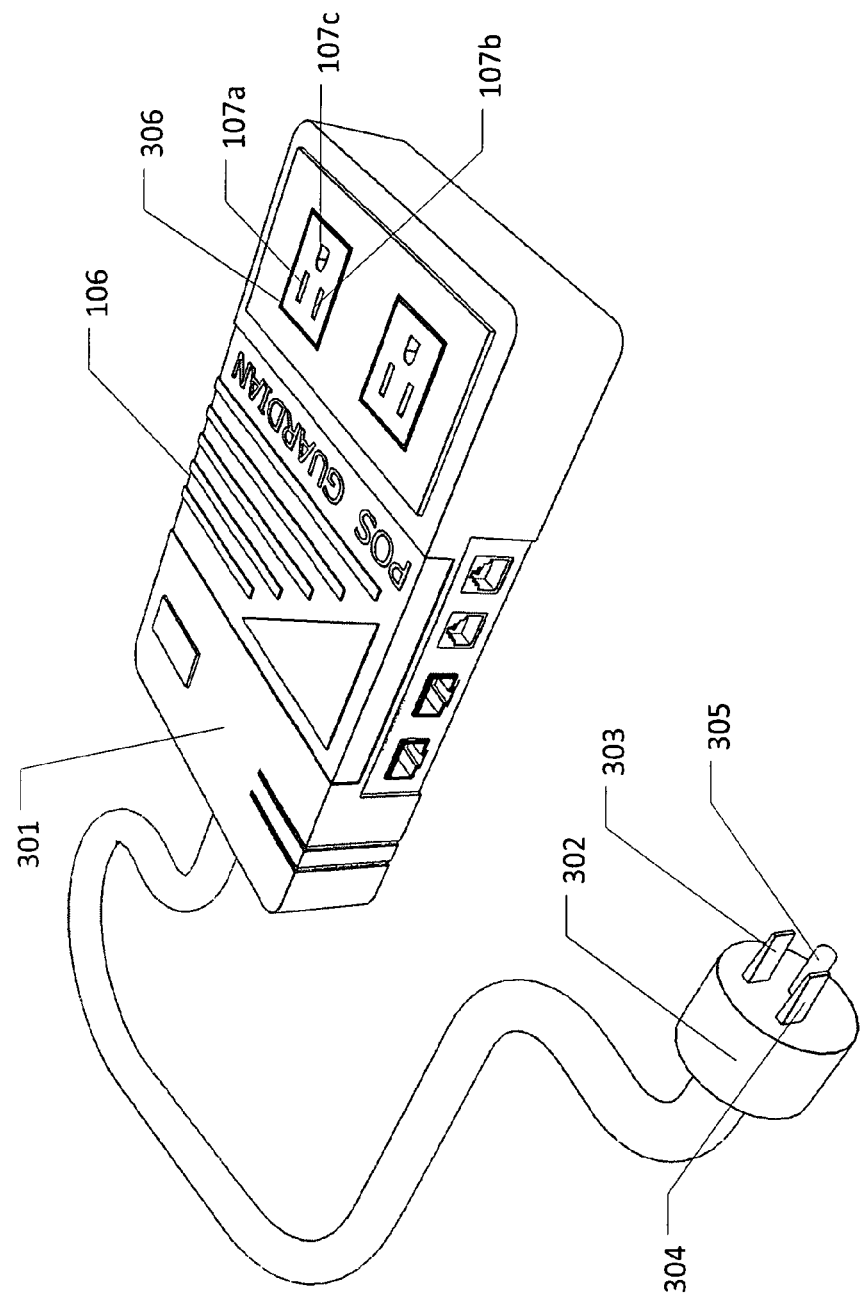
FIG. 3 illustrates a GFCI compatible CMN suppressor.

FIG. 3 illustrates CMN suppressor 106. CMN suppressor 106 can comprise a housing 301, a power cord 302, and one or more electrical receptacles 306. Housing 301 can protect electronic components of CMN suppressor 106. CMN suppressor 106 can comprise a hot line 303, a neutral line 304 and a ground line 305 that pass through power cord 302 to electrically connect GFCI protected nodes 105 to the internal circuitry of CMN suppressor 106, as discussed below. CMN sensitive device 108 can connect to CMN suppressor 106 by connecting it to CMN monitored nodes 107 by plugging CMN sensitive device 108 into electrical receptacle 306.

Figure 4:
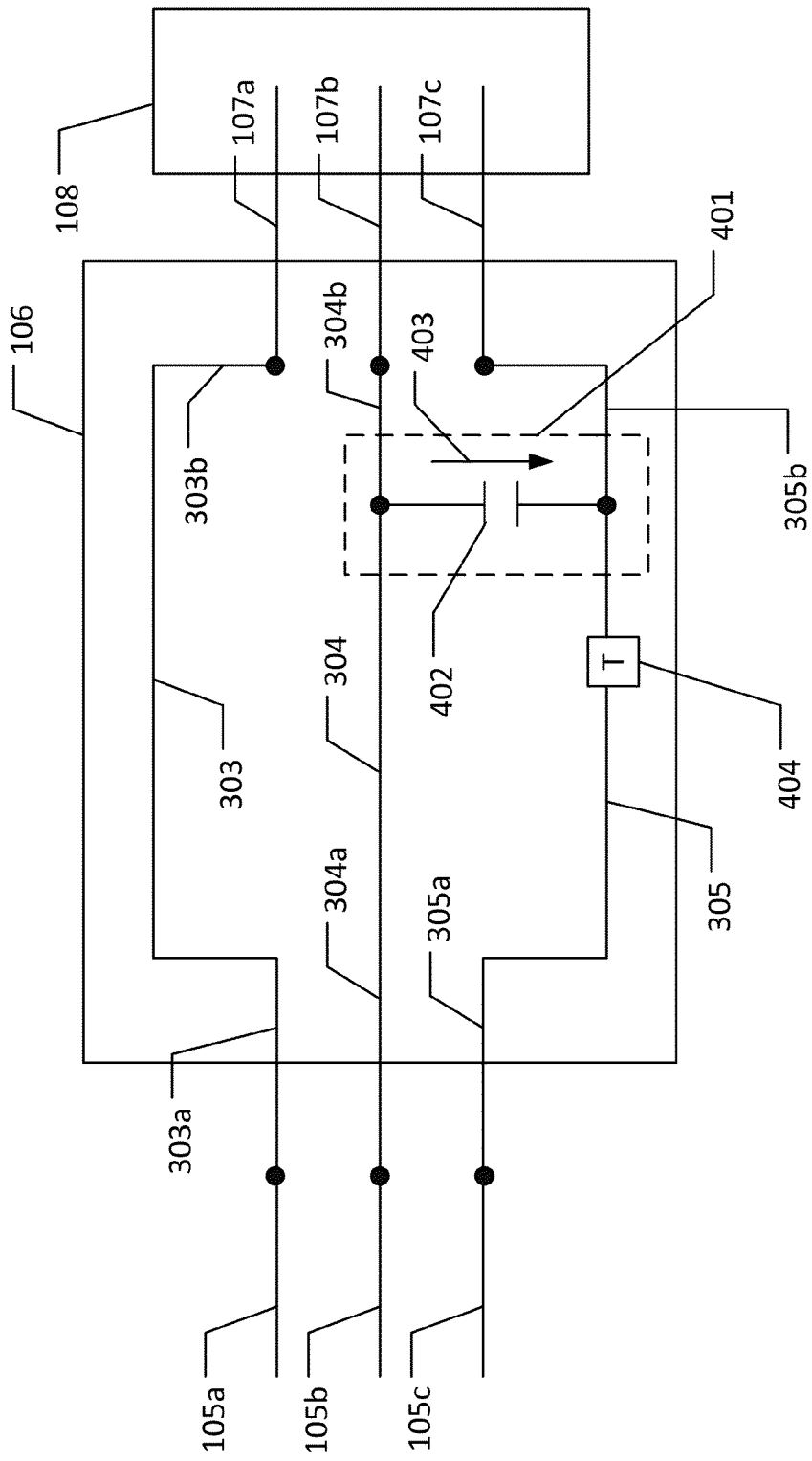
FIG. 4 illustrates a block schematic diagram of a preferred embodiment of a GFCI compatible CMN suppressor.

FIG. 4 illustrates a preferred embodiment of CMN suppressor 106. Hot line 303, neutral line 304, and ground line 305, each having a first end 303a, 304a, and 305a can connect to GFCI protected nodes 105a, 105b, and 105c, respectively, as discussed above. Further hot line 303, neutral line 304 and ground line 305 can each have a second end 303b, 304b, 305b connectable to CMN monitored node 107a, 107b, and 107c respectively. CMN 109 can enter into CMN suppressor 106 through GFCI protected node 105. CMN surge suppressor 106 can further comprise a high pass filter 401 that connects neutral line 304 to ground line 305. In one embodiment, high pass filter 401 can comprise or even consist essentially of a capacitor 402. High pass filter 401 can block low frequency power signals such as those of 50-60[Hz] while allowing high frequency signals to pass. High pass filter 401 can allow CMN 109 to be shunted to ground line 305 instead of being conducted to CMN sensitive device 108 through neutral line second end 304b. A leakage current 403 can be caused by CMN 109 that passes through capacitor 402. Capacitor 402 can have impedance sufficient to limit leakage current 403 to an acceptable amount, such as that defined by UL 943, which limits leakage current 403 to less than 4-6 [mA]. CMN suppressors 108 with higher ampacities require higher impedances in order to limit leakage current 403. Therefore, in higher ampacity CMN suppressors 108, capacitor 402 can have a lower capacitance. For example, CMN suppressor 108 rated for 15 A will require a capacitor with a capacitance less than or equal to 1.8 [μF] to limit leakage current 403. However, a CMN suppressor 108 rated for 30 [A] will require a smaller capacitor with a capacitance of 1.35 [μF]. In either case, inventors teach a system using a capacitor rated between 0.1 [μF] and 1 [μF], well below UL thresholds.

CMN suppressor 106 can further comprise a toroid 404 located on ground line 305 upstream of high pass filter 401. For the purposes of this disclosure, toroid is a toroidal coil inductor, upstream is defined as between the referenced component and electrical supply 100, and downstream is defined as between the referenced component and CMN sensitive device 108.

Figure 5A:
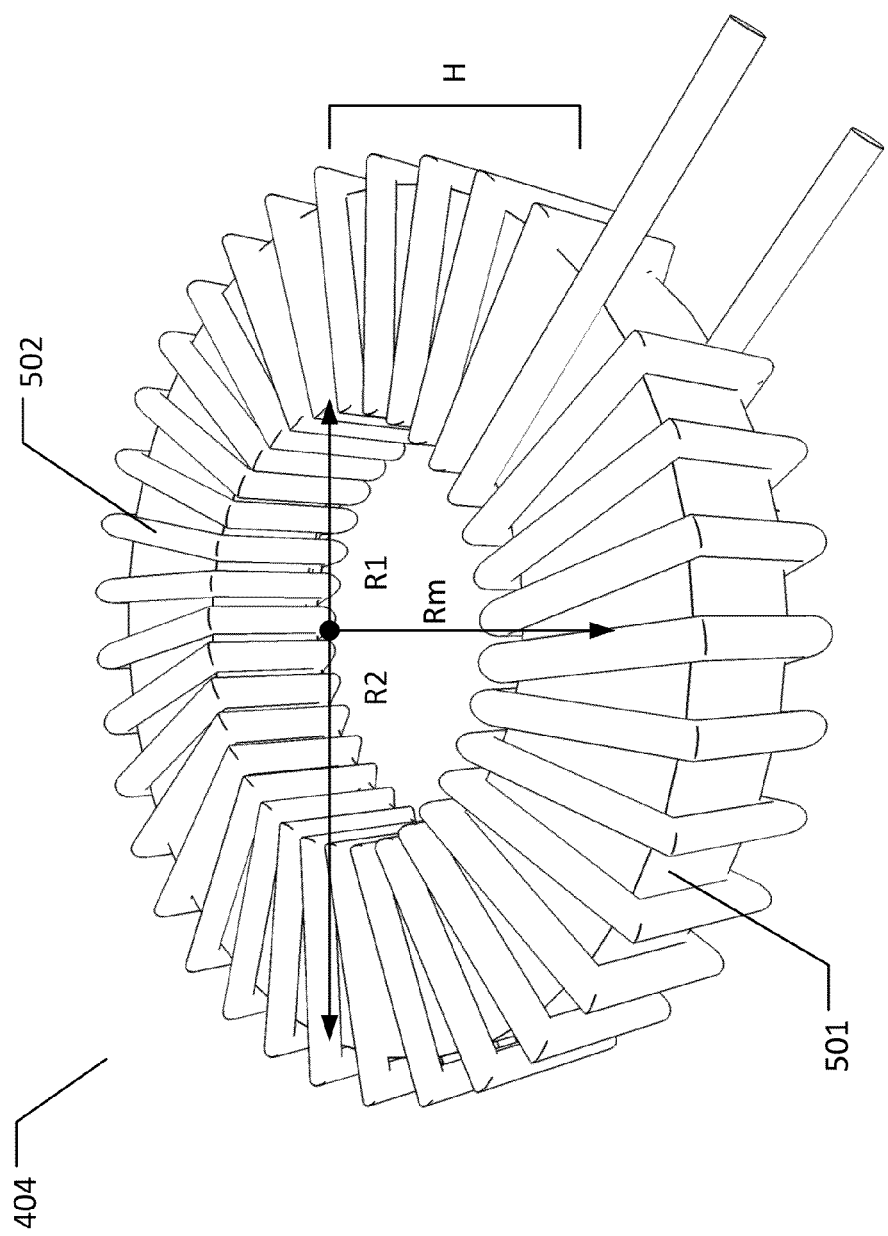
FIG. 5A illustrates a toroid.

FIG. 5A illustrates toroid 404. UL 943 limits the impedance of ground line 305. Historically, this has prevented components from being placed within ground line 305. However, toroid 404 as taught within this disclosure can be designed to both assist in blocking CMN 109 while satisfying the rigorous UL conditions related to ground line impedance. Toroid 404 can be constructed of a wire 501 and a core 502. A cross section of core 502 can be, but is not limited to, rectangular or circular. FIG. 5A illustrates toroid 502 having a rectangular cross section. Toroid 404 can have a number of physical characteristics that determine its electrical response characteristics. Such physical characteristics can include a winding height h, an inner radius $R_1$, an outer radius $R_2$, a middle radius $R_M$ a cross sectional area A, a number of turns N, a core relative permeability $\mu_r$, and a wire gauge. To accommodate UL guidelines pertaining to ground lines, the size of wire 501 can be greater than or equal to the wire size of GFCI monitored node 105a and neutral GFCI monitored node 105b of CMN suppressor 106. For example, CMN suppressor 106 rated 15 [A] must have toroid 404 built with 14 AWG wire.

Electrical response characteristics of toroid 404 can comprise an inductance and impedance (resistance and reactance). Such electronic response characteristics can vary depending on whether toroid 404 is operating at or below normal operating current limit, or when excessive current causes core 502 to become saturated. Normal operation inductance of toroid 404 can be calculated based on its dimensions. For toroid 404 having a rectangular cross section as shown in FIG. 5A, the following formula can be used to calculate inductance:

$$L = .002N^2 \cdot \mu_r \cdot h \cdot \ln\left(\frac{R_2}{R_1}\right) [\text{mH}].$$

For toroid 502 having a circular cross section, the following formula can be used to calculate inductance:

$$L = \frac{\mu \cdot N^2 \cdot A}{2\pi R_M} [\text{mH}].$$

Reactance of toroid 502 is a function of inductance and frequency, using the formula $X = 2\pi fL$. The resistance can be calculated by multiplying the length of wire 404 by its resistance per interval, however the resistance will generally be negligible.

As a non-limiting example, toroid designed for a 20 [A] circuit can comprise core 404 having a manganese-zinc (Mn—Zn) ferrite, a 12 A.W.G. wire 501 with 23 turns, inner radius 15 [mm], outer radius 25 [mm], and height 10 [mm]. Such toroid 404 can have an impedance of 4.1 [mH]. As another non-limiting example, toroid designed for a 15 [A] circuit can comprise core 404 having an Mn—Zn ferrite, a 14 A.W.G. wire 501 with 35 turns, inner radius 15 [mm], outer radius 25 [mm], and height 10 [mm]. Such toroid 404 can have an impedance of 6.05 [mH]. In one embodiment, core 502 can comprise materials having a similar permeability to Mn—Zn ferrite. In the alternative, materials having a different permeability may be used to achieve similar electrical response characteristics by changing the physical dimensions of core 502.

Figure 5B:
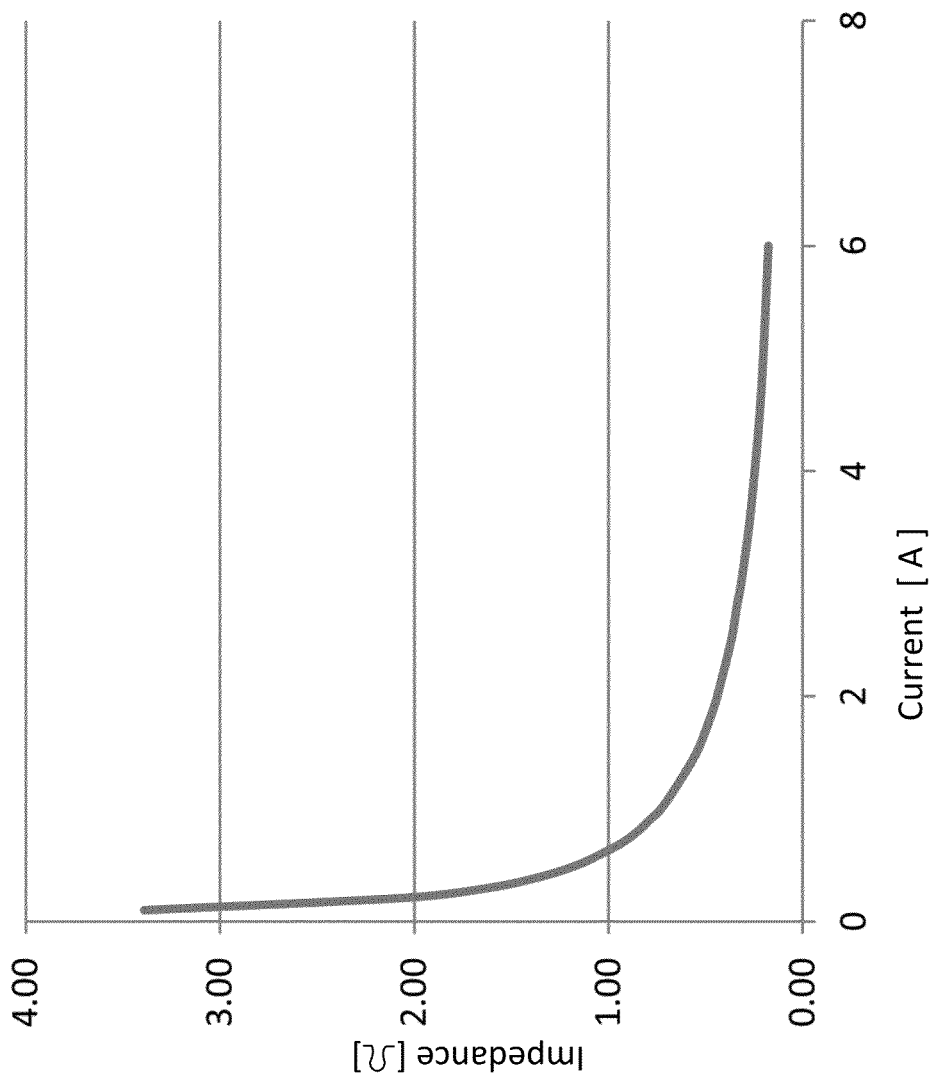
FIG. 5B illustrates a graph displaying toroid impedance as a function of ground current.

FIG. 5B illustrates a graph displaying toroid impedance as a function of ground current. Inductance of toroid 404 can remain fairly stable across a frequency spectrum as long as toroid 404 remains unsaturated. However, if current through toroid 404 exceeds a normal operation current level, toroid 404 will become saturated with magnetic flux, and the inductance of toroid 404 can drop rapidly, thereby causing toroid 404 to have very low impedance. In a preferred embodiment, impedance of toroid 404 can be less than 0.1 [Ω] for 60 Hz signals during fault conditions. By comparison, toroid 404 will have much higher impedance for signals in frequency ranges containing CMN 109. As such, CMN 109 coming from GFCI monitored ground node 105c can be blocked, while fault currents to GFCI monitored ground node 105c can pass. Toroid 404 in embodiments described above can saturate if current exceeds between one and two amps. However, such saturation level can be adjusted by changing physical characteristics of toroid 404.

Figure 5C:
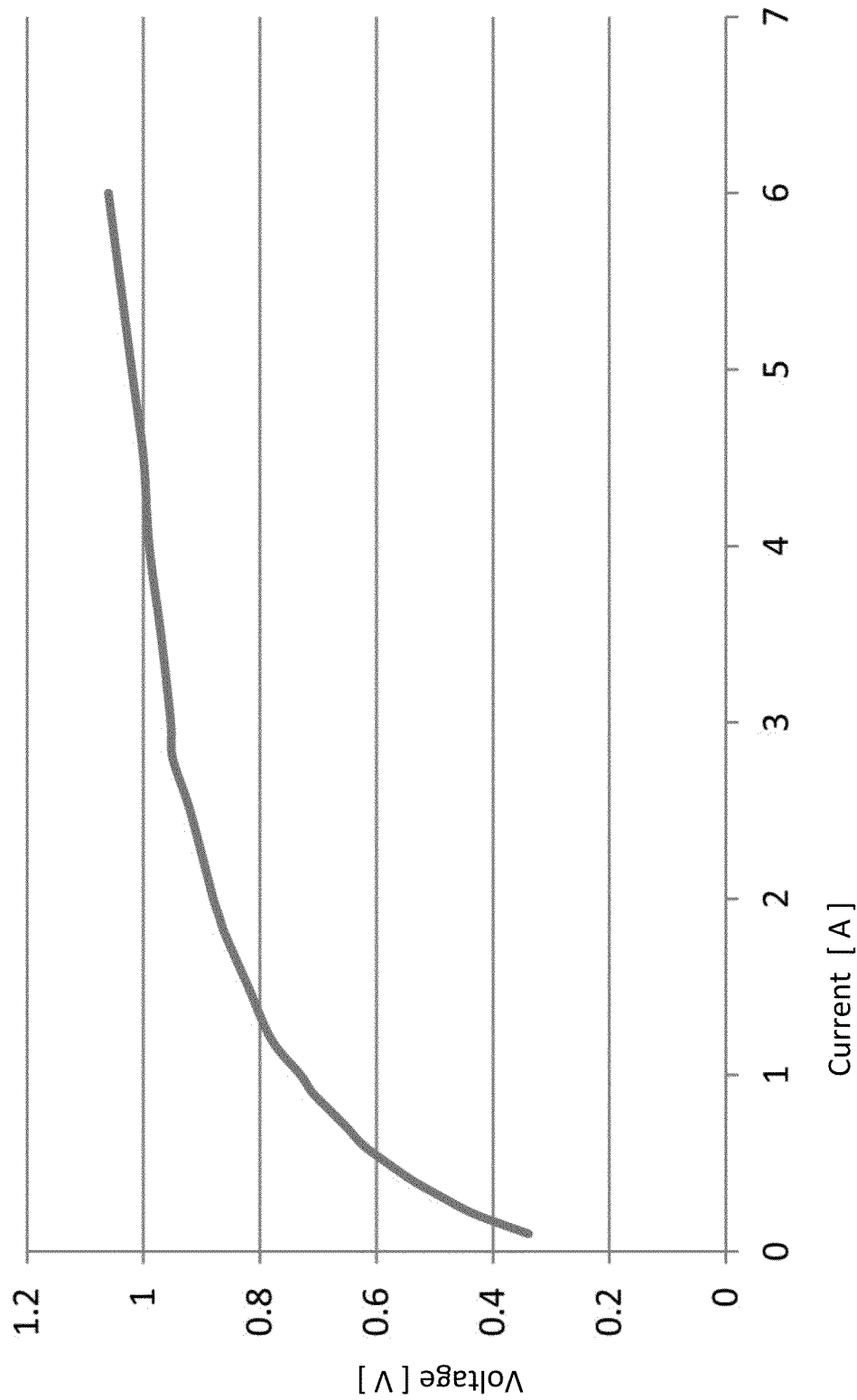
FIG. 5C illustrates a graph displaying voltage drop across a toroid as a function of fault current.

FIG. 5C illustrates a graph displaying voltage drop across toroid 404 as a function of fault current. Because the impedance of toroid 404 drops as fault current increases, the voltage drop across toroid 404 remains very low. For example, a 25 [A] fault current can produce a voltage drop across toroid 404 of less than 2.5[V].

FIGS. 6A, 6B, 6C, and 6D together illustrate a schematic diagram of a preferred embodiment of CMN suppressor 106. In addition to the components discussed above, CMN suppressor 106 can comprise one or more of the following elements: 1) a first stage surge arrestor 601; 2) an overvoltage detection circuit 602; 3) a no ground and reverse polarity detection and control circuit 603; 4) one or more power relay actuators and coils 604; 5) a hot line disconnecting circuit 605; 6) a neutral line circuit disconnecting circuit 606; 7) a first indicator circuit for fault detection 607; 8) a second indicator circuit for normal condition 608; 9) a second stage surge arrestor 609; 10) a noise attenuation, transformer and capacitor tank circuit 610; 11) a third stage surge arrestor 611; and/or 312) a relay circuit for connecting high pass filter 401 across neutral 612.

First stage surge suppressor 601 can comprise two MOVs VR7 and VR8. MOV VR7 can be connected between hot line 303 and neutral line 304. VR8 can be connected between neutral line 304 and ground line 305. First stage surge suppressor 601 can protect CMN suppressor 106 and CMN sensitive device 108 from voltage surges such as those caused by lightning strikes.

Overvoltage detection circuit 602, can comprise a diode CR6, a resistor R6, a resistor R7, a resistor R8, a resistor R9, a resistor R10, a capacitor C3 and a zener diode Z1. No ground and reverse polarity detection and control circuit 603 can comprise of a BJT transistor TR1, a resistor R4, a resistor R5, a diode CR4, a zener diode Z2, a capacitor C10, and a thyristor TH1. Power relays actuators and coils 604 can comprise a capacitor C1, a resistor R3, a diode CR7, a resistor R13, a hot line relay K1A, and a neutral line relay K2A. Hot line disconnecting circuit 605 can comprise a hot line relay contact K1. Neutral line disconnecting circuit 606 can comprise a neutral line relay contact K2.

When the components of overvoltage detection circuit 602 are properly sized, overvoltage detection circuit 602 can detect a voltage that exceeds a set point and can cause BJT transistor TR1 to stop conducting electrical current. When BJT transistor TR1 stops conducting, thyristor TH1 can also stop conducting. Under this condition, hot line relay K1A and neutral line relay K2A can de-energize. When hot line relay K1A de-energizes, hot line relay contact K1 can change state, disconnecting hot line 303 from downstream components of CMN suppressor 106, thereby protecting them from the overvoltage condition. Likewise, when neutral line relay K2A de-energizes, neutral line relay contact K2 can change state disconnecting neutral line 304 from downstream components of CMN suppressor 106 thereby protecting them from the overvoltage condition. If CMN suppressor 106 becomes disconnected from ground, or the polarity of hot line 303 and neutral line 304 are swapped, no ground and reverse polarity detection and control circuit 603 can remove the gate voltage from thyristor TH1, which can cause it to cease conducting electrical current. When thyristor TH1 ceases to conduct electrical current, hot line relay K1A and neutral line relay K2A can de-energize. As above, when hot line relay K1A and neutral line relay K2A are de-energized, hot line relay contact K1 and neutral line relay contact K2 can change state. When hot line relay contact K1 changes state, it can disconnect hot line 303 from downstream components of CMN suppressor 106. Likewise, when neutral line relay contact K2 changes state it can disconnect neutral line 304 from downstream components of CMN suppressor 106.

The order in which hot line relay K1A and neutral line relay K2A energize and de-energize can also affect CMN suppressor's 106 compatibility with GFCI 104. When hot line relay contact K1 and neutral line relay contact K2 open and close, they can cause transient currents, which can potentially travel to ground 305 through high pass filter 401. These transient currents can enter GFCI monitored node 105 and can cause GFCI 104 to trip the circuit unnecessarily. Further, since hot line relay K1A and neutral line relay K2A require that CMN suppressor 106 is powered to function, hot line relay K1A and neutral line relay K2A will energize when CMN Suppressor 106 is powered. Simply energizing hot line relay K1A and neutral line relay K2A can cause GFCI 104 to trip if hot line relay K1A trips before neutral line relay K2A. In order to prevent this, resistor R13 can be connected in parallel with hot line relay K1A. The parallel combination of hot line relay K1A and resistor R13 can be connected in series with neutral line relay K2A. In such embodiment, resistor R13 must be sized such that hot line relay K1A will experience a slightly smaller voltage drop across it than the voltage drop across neutral line relay K2A. Such resister R13 can, in one embodiment, be 10 [kΩ] or more. In one embodiment, resistor R13 can be around 39 [kΩ].

Figure 6A:
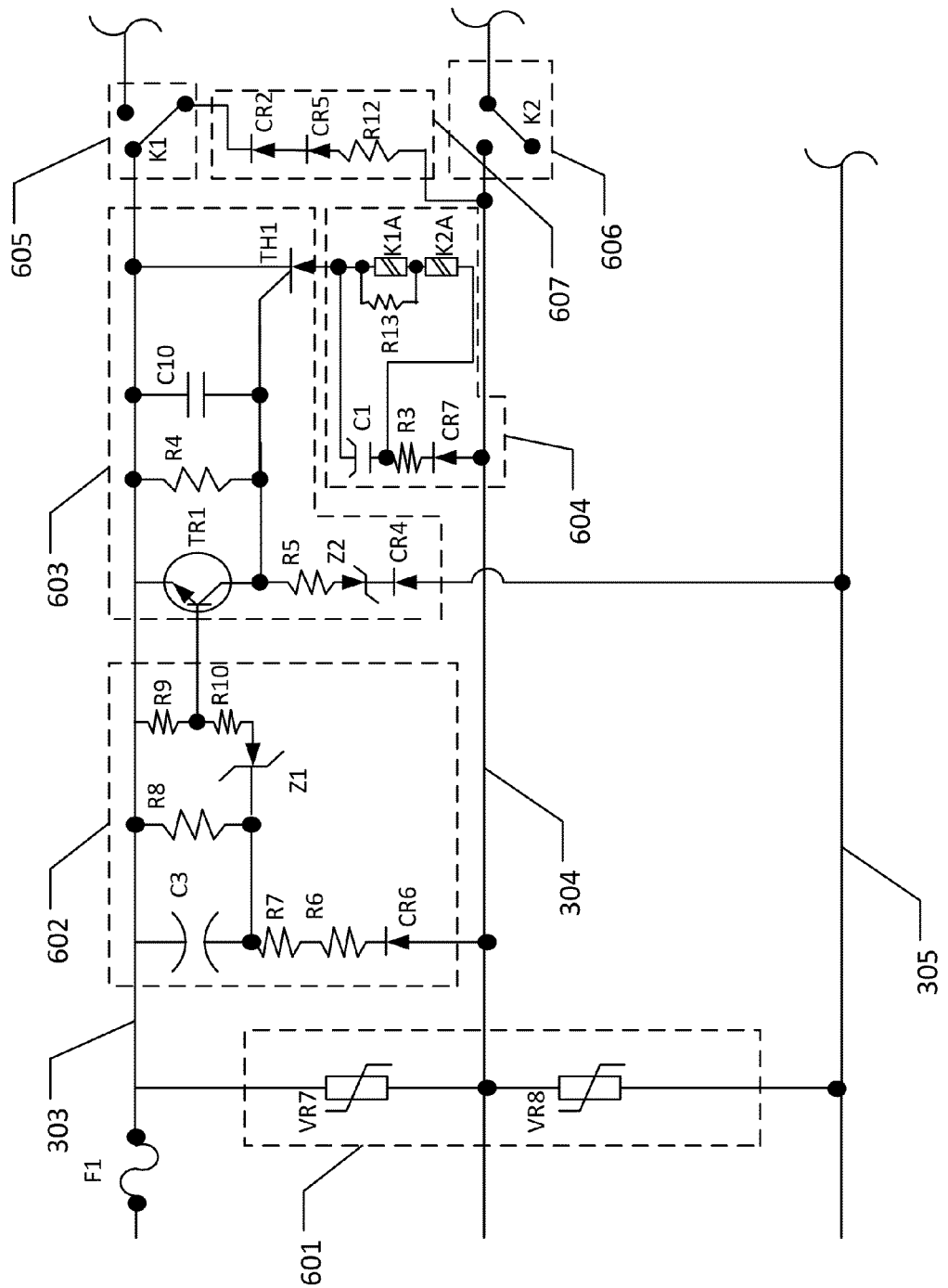
FIGS. 6A, 6B, 6C, and 6D together illustrate a schematic diagram of a preferred embodiment of a CMN suppressor.
Figure 6B:
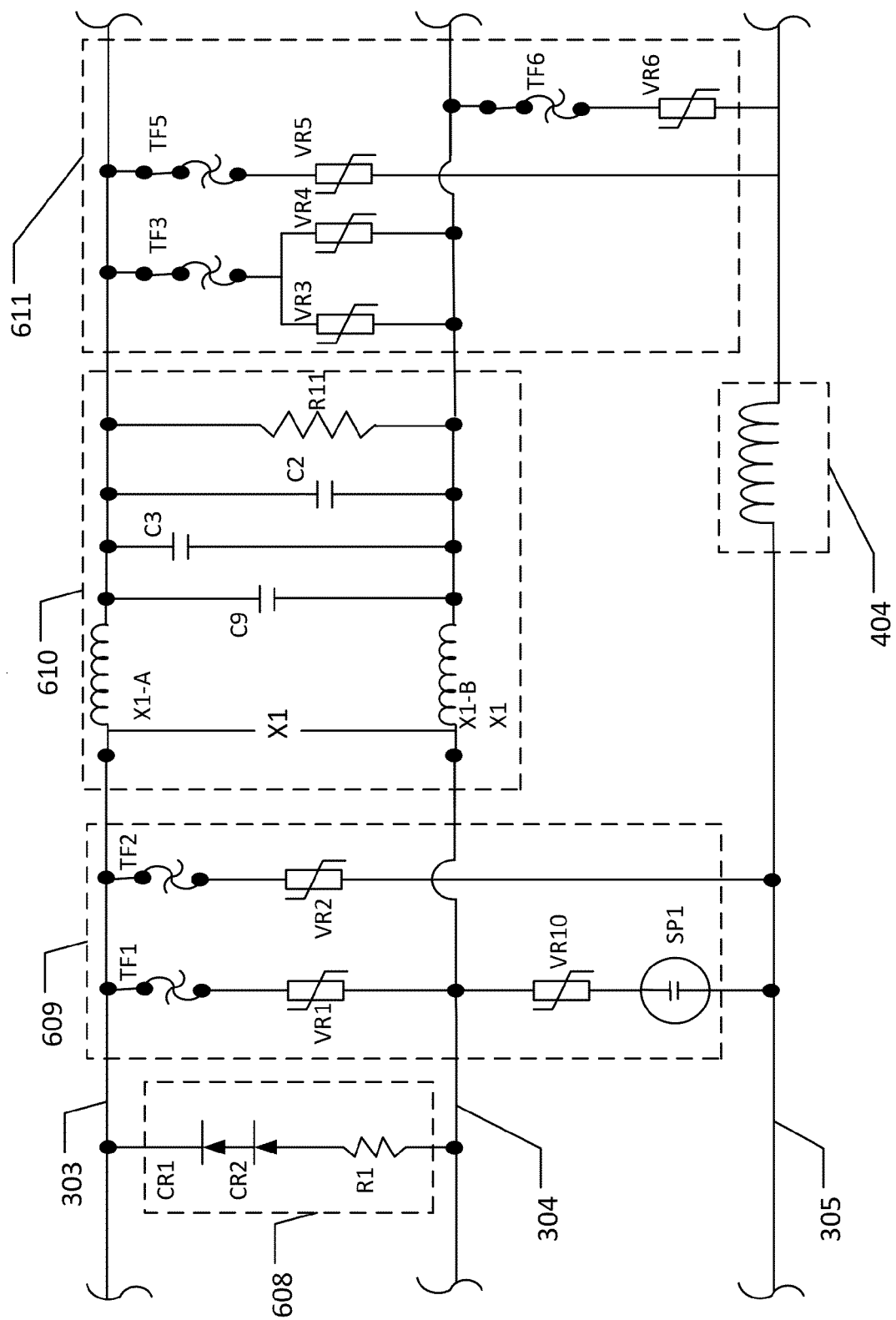
Figure 6C:
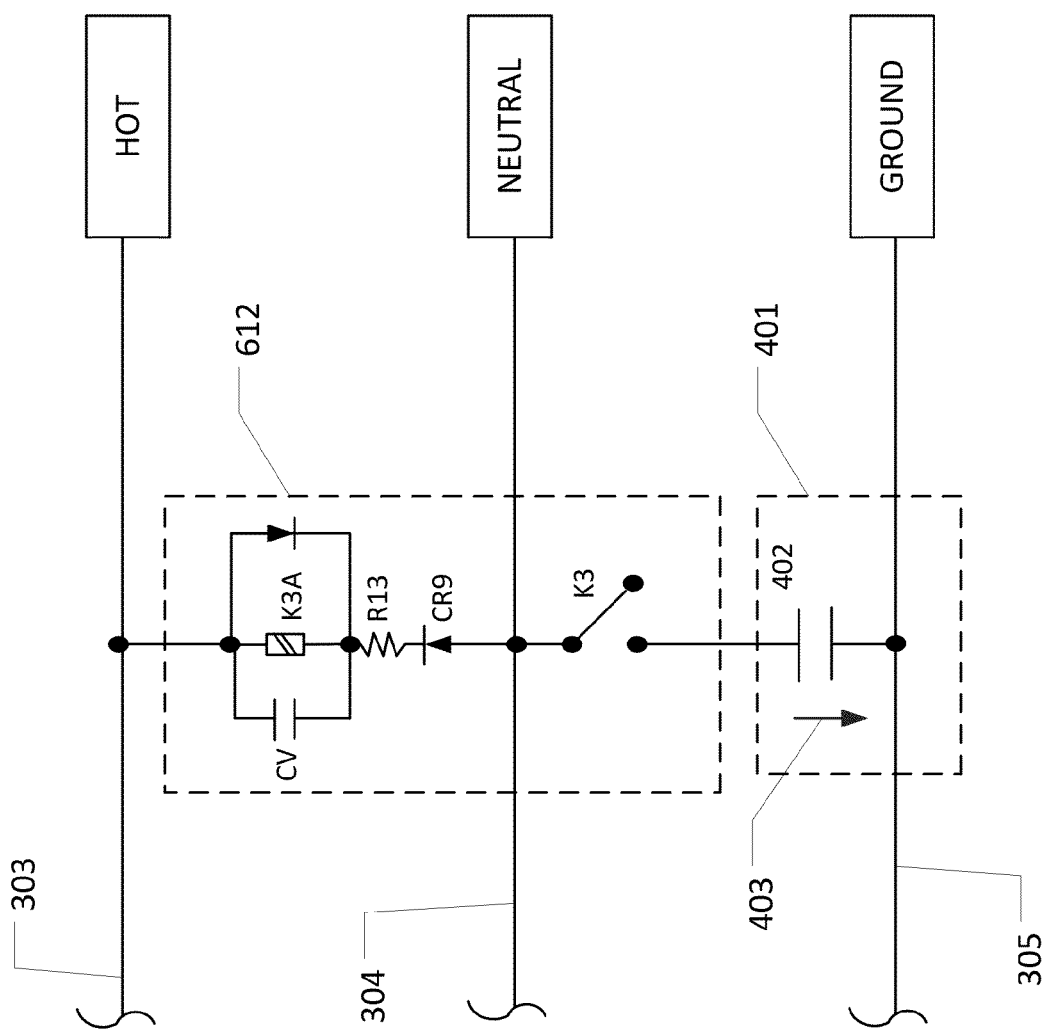
Figure 6D:
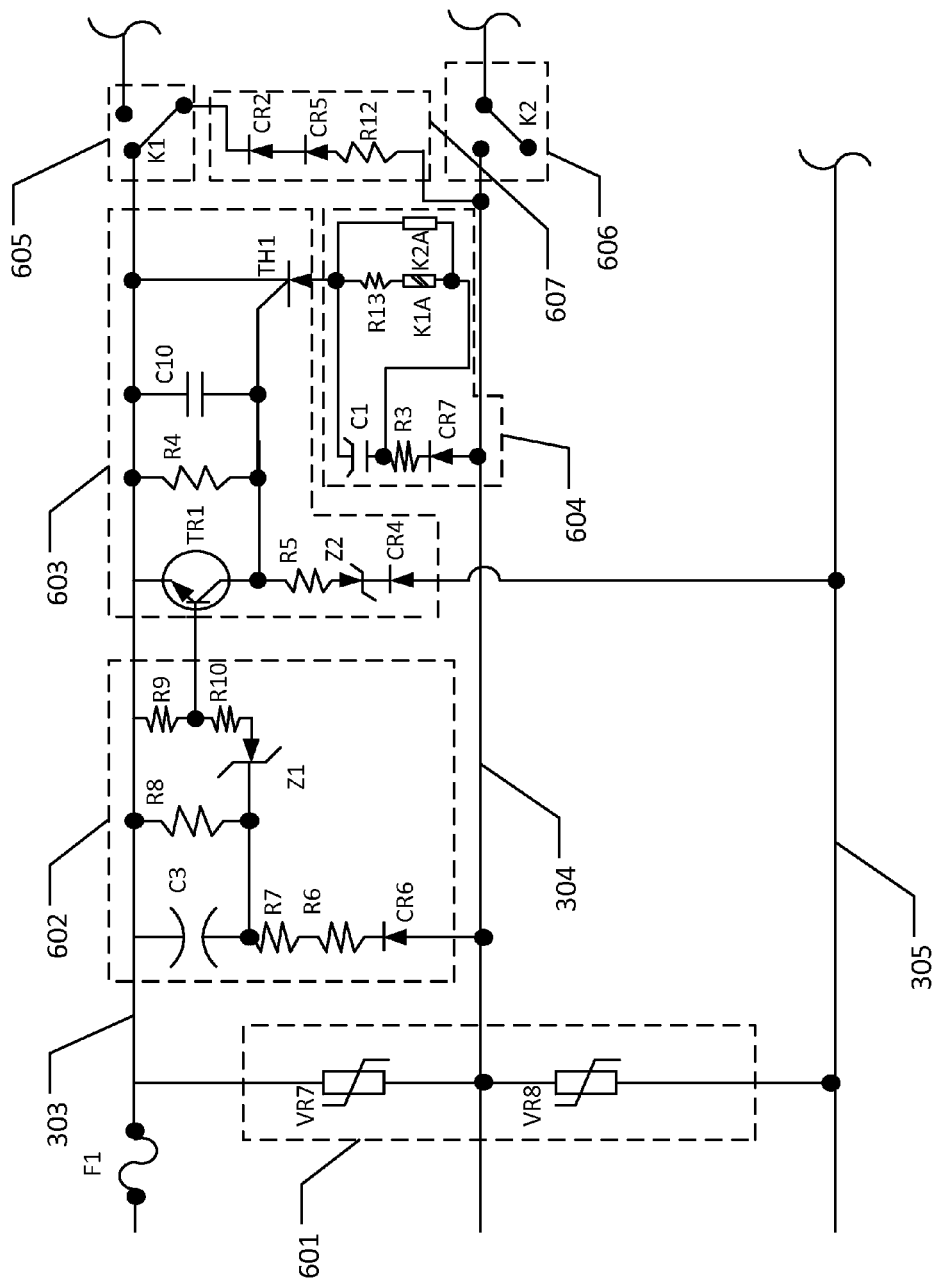

In the alternative, hot line relay K1A can be connected in series with resistor R13, as shown in FIG. 6D. The series combination of hot line relay K1A and resistor R13 can be connected in parallel with neutral line relay K2A. In such embodiment, resistor R13 can again be sized to ensure a slightly smaller voltage drop across hot line relay K1A than neutral line relay K2A. In such embodiment, R13 can have a very small resistance. As such, resistor R13 can cause hot line relay K1A to de-energize before neutral line relay K2A thus causing hot line relay contact K1 to change state and disconnect hot line 303 before neutral line relay contact K2 disconnects the neutral. Likewise, when hot line relay K1A and neutral line relay K2A are energized, resistor R13 can delay hot line relay K1A from changing state long enough for neutral line relay K2A to change state. This order of operation can allow for neutral line 304 to be connected through neutral line relay contact K2 before hot line 303 is connected through hot line relay contact K1. Further, this order of operation can prevent GFCI 104 from tripping unnecessarily by ensuring that transient signals will have a path through GFCI monitored neutral node 105b.

First indicator circuit for fault detection 607 can comprise a resistor R12, a diode CR5 and a red light emitting diode CR2. When neutral line relay contact K2 changes state, red light emitting diode CR2 can emit a red light indicating to an operator that there is an electrical fault in CMN suppressor 106. Second indicator circuit for normal condition 608 can comprise a resistor R1, a diode CR2 and a green light emitting diode CR1. This circuit can emit a green light whenever CMN suppressor 106 is energized and operating normally.

Second stage surge arrestor 609 can comprise a first thermal fuse TF1 and a second thermal fuse TF2, an MOV VR1, an MOV VR2, an MOV VR10, and a gas tube SP1. MOV VR1 can suppress surges between hot line 303 and neutral line 304. MOV VR2 can suppress surges between hot line 303 and ground line 305. MOV VR10 and gas tube SP1 can be connected in series and can suppress surges between neutral line 304 and ground line 305.

Noise attenuation, transformer and capacitor tank circuit 610 can comprise of an isolation transformer X1, a resistor R11, a capacitor C2, a capacitor C3, and a capacitor C9. Isolation transformer X1 can comprise a winding X1-A and a second winding X1-B. Capacitors C2, C3, and C9 can be sized to allow high frequency currents to pass from hot line 303 to neutral line 304 with very low impedance and can also block out 50-60 [Hz] electrical signals. This can be possible because the electrical impedance of a capacitor decreases as a signal's frequency increases. By allowing a low impedance path for high frequency electrical signals, noise attenuation, transformer and capacitor tank circuit 610 can prevent these signals from being transmitted downstream to CMN sensitive device 108.

Third stage surge arrestor 611 can comprise of a first thermal fuse TF3, a second thermal fuse TF5, a third thermal fuse TF6, an MOV VR3, an MOV VR4, an MOV VR5 and an MOV VR6. Third stage surge arrestor 611 can protect against surges between hot line 303 and neutral line 304; hot line 303 and ground line 305; and neutral line 304 and ground line 305. Relay circuit for connecting the capacitor across the neutral 612 can comprise a high pass filter relay K3A, a high pass filter relay contact K3, a diode CR9, a diode CR10, a resistor R13 and a capacitor C11. Relay circuit for connecting the capacitor across the neutral 612 can be designed to limit a leakage current 403 between neutral line 304 and ground line 305 to below the threshold current discussed above. Relay circuit for connecting the capacitor across neutral 612 can detect when leakage current 403 meets or exceeds the threshold, which can be based on the UL 943 standard. When relay circuit for connecting the capacitor across neutral 612 detects that leakage current 403 exceeds the threshold current, high pass filter relay K3A can de-energize and high pass filter relay contact K3 can disconnect high pass filter 401 from neutral line 304.

Various changes in the details of the illustrated operational methods are possible without departing from the scope of the following claims. Some embodiments may combine the activities described herein as being separate steps. Similarly, one or more of the described steps may be omitted, depending upon the specific operational environment the method is being implemented in. It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A GFCI compatible system for reducing common mode noise comprising:
   a hot line having a first end connectable to a GFCI protected hot node and a second end connectable to a common mode noise (CMN) sensitive device hot line;
   a neutral line having a first end connectable to a GFCI protected neutral node and a second end connectable to a CMN sensitive device neutral line;
   a ground line having a first end connectable to an electrical ground and a second end connectable to a CMN sensitive device ground line;
   a high pass filter connected between said neutral line and said ground line;
   a hot line relay contact operable to open and close;
   a neutral line relay contact operable to open and close;
   a hot line relay capable of opening and closing said hot line relay contact; and
   a neutral line power relay capable of opening and closing said neutral line relay contact, wherein said neutral line relay is capable of opening said neutral line relay contact when said hot line relay contact is open, further wherein said hot line relay is capable of closing said hot line relay contact when said neutral line relay contact is closed.

2. The GFCI compatible system of claim 1 wherein said hot line relay is connected in series with said neutral line relay.

3. The GFCI compatible system of claim 2 further comprising a resistor connected in parallel with said hot line relay.

4. The GFCI compatible system of claim 3 wherein said resistor is greater than 10 [kΩ].

5. The GFCI compatible system of claim 1 wherein said hot line relay is connected in parallel with said neutral line relay.

6. The GFCI compatible system of claim 5 further comprising a resistor is connected in series with said hot line relay.

7. The GFCI compatible system of claim 6 wherein said resistor is less than 20[Ω].

8. The GFCI compatible system of claim 1 further comprising:
   a high pass filter relay contact capable of disconnecting said high pass filter; and
   a high pass filter relay connected between said hot line and said neutral line that controls said high pass filter relay contact.

9. A method of connecting a CMN suppressor to a GFCI protected load comprising the steps:
   connecting first ends of a hot line, a neutral line, and a ground line within a CMN suppressor to a GFCI protected hot node, a GFCI protected neutral node, and a GFCI protected ground node, said CMN suppressor comprising a high pass filter connecting said neutral line to said ground line, a hot line relay contact capable of opening and closing within said hot line, a neutral line relay contact capable of opening and closing within said neutral line, a hot line relay capable of controlling said hot line relay contact, and a neutral line relay capable of controlling said neutral line relay contact;
   closing said neutral line relay contact using said neutral line relay; and
   closing said hot line relay contact using said hot line relay, only after closing said neutral line relay contact.

10. The method of claim 9 further comprising the step of opening said hot line relay contact using said hot line relay before opening said neutral line relay contact.

11. The method of claim 10 further comprising the step of opening said neutral line relay contact using said neutral line relay.

12. The method of claim 11 wherein said hot line relay is connected in series with said neutral line relay.

13. The method of claim 12 further comprising the step of using a resistor connected in parallel with said hot line relay to cause a first voltage drop across said hot line relay to be less than a second voltage drop across said neutral line relay.

14. The method of claim 11 wherein said hot line relay is connected in parallel with said neutral line relay.

15. The method of claim 12 further comprising the step of using a resistor connected in series with said hot line relay to cause a first voltage drop across said hot line relay to be less than a second voltage drop across said neutral line relay.

* * * * *